United States Patent
Cheng

(10) Patent No.: US 10,674,631 B1
(45) Date of Patent: Jun. 2, 2020

(54) THIN VAPOR CHAMBER WITH CIRCUIT UNIT

(71) Applicant: FORCECON TECHNOLOGY CO., LTD., Zhubei, Hsinchu County (TW)

(72) Inventor: Cheng-Chen Cheng, New Taipei (TW)

(73) Assignee: FORCECON TECHNOLOGY CO., LTD., Zhubei, Hsinchu (TW)

( * ) Notice: Subject to any disclaimer, the term of this patent is extended or adjusted under 35 U.S.C. 154(b) by 0 days.

(21) Appl. No.: 16/505,079

(22) Filed: Jul. 8, 2019

(51) Int. Cl.
*H05K 7/20* (2006.01)
*F28D 15/04* (2006.01)
*H01L 23/427* (2006.01)

(52) U.S. Cl.
CPC ....... H05K 7/20336 (2013.01); F28D 15/046 (2013.01); H01L 23/427 (2013.01)

(58) Field of Classification Search
CPC .. H05K 7/2029–20336; H05K 7/20881; F28D 15/04–046; H01L 23/473; H01L 23/427
USPC .................. 361/700; 165/80.4–80.5, 104.33
See application file for complete search history.

(56) References Cited

U.S. PATENT DOCUMENTS

| | | | | |
|---|---|---|---|---|
| 8,243,449 B2* | 8/2012 | Oniki | ................... | F28D 1/0391 165/104.21 |
| 8,316,921 B2* | 11/2012 | Hou | ................... | F28D 15/0233 165/104.21 |
| 9,163,883 B2* | 10/2015 | Yang | ................... | F28D 15/0241 |
| 9,179,577 B2* | 11/2015 | Moon | ................. | H05K 7/20336 |
| 9,651,312 B2 | 5/2017 | Yang et al. | | |
| 9,909,814 B2 | 3/2018 | Yang et al. | | |
| 9,921,004 B2 | 3/2018 | Lewis et al. | | |
| 2007/0012429 A1* | 1/2007 | Siu | ...................... | F28D 15/0233 165/104.33 |
| 2014/0083653 A1* | 3/2014 | Kempers | ................. | F28F 13/04 165/104.26 |
| 2017/0030654 A1 | 2/2017 | Yang et al. | | |
| 2019/0390919 A1* | 12/2019 | Lewis | ................... | F28D 15/046 |

FOREIGN PATENT DOCUMENTS

WO    WO-2017015814 A1 *  2/2017  ........... H01L 23/427

\* cited by examiner

*Primary Examiner* — Zachary Pape
(74) *Attorney, Agent, or Firm* — Egbert Law Offices, PLLC

(57) ABSTRACT

A thin vapor chamber with circuit unit is provided, which has a first flexible substrate structure and a second flexible substrate structure, wherein the first flexible substrate structure and the second flexible substrate structure relatively enclose a working fluid. A plurality of wicking spaces is formed between the first flexible substrate structure and the second flexible substrate structure. A circuit unit is formed at least partially on the side of the first flexible substrate structure or the second flexible substrate structure away from the working fluid, so as to integrate the electronic components and circuit units, and to evenly dissipate the heat generated by the electronic components and circuit units. The present invention makes an effective improvement to the space efficiency of the electronic device.

18 Claims, 4 Drawing Sheets

US 10,674,631 B1

THIN VAPOR CHAMBER WITH CIRCUIT UNIT

CROSS-REFERENCE TO RELATED U.S. APPLICATIONS

Not applicable.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

BACKGROUND OF THE INVENTION

1. Field of the Invention

The present invention relates generally to a thin heat dissipation structure and more particularly to an innovative thin vapor chamber with circuit unit.

2. Description of Related Art Including Information Disclosed Under 37 CFR 1.97 and 37 CFR 1.98

A vapor chamber is a heat transmission structure applied in electronic devices, which includes a substrate and a cover plate. A chamber is formed between the substrate and the cover plate. Inside the chamber, there is a working fluid and a wicking structure. The working fluid is used to absorb and release the heat. The wicking structure is used to guide the flow of the working fluid. Moreover, through the wicking structure, the chamber is formed with a plurality of wicking spaces. The substrate and the cover plate are respectively formed by laminating a heat conductive film, a polymer film and an external film. The polymer film is formed between the metal heat conductive film and the external protection film. The heat conductive films of the substrate and the cover plate are respectively on the side facing the chamber.

The wicking structure guides the flow of the working fluid, and the working fluid absorbs and releases heat to have a phase transition. In this way, the vapor chamber can rapidly absorb massive heat and dissipate the heat quickly to maintain a uniform temperature.

All electronic components or circuit units (such as processing units, batteries, or antennae) may generate massive heat during operation. An electronic device like a mobile phone, a Tablet PC, or a Notebook is normally configured with multiple electronic components and circuit units that can easily generate massive heat, as mentioned above. Each of the above-said electronic components and circuit units forms a heat source inside the electronic device. By providing a vapor chamber for each of electronic components and circuit units like processing units, batteries, and antennae that can generate massive heat, each of the vapor chambers can respectively dissipate the heat generated by each of the electronic components and circuit units and maintain an even temperature for reliable operation of the electronic device.

BRIEF SUMMARY OF THE INVENTION

The primary object of the present invention is to provide a thin vapor chamber with circuit unit, aiming to find a technical solution and make a breakthrough to develop a practically ideal innovative vapor chamber structure that can integrate multiple electronic components and circuit units to improve the space efficiency of the electronic devices.

Based on said purpose, the present invention is to provide a thin vapor chamber with circuit unit, comprising a plate-like first flexible substrate structure and a plate-like second flexible substrate structure, wherein said first flexible substrate structure and said second flexible substrate structure relatively enclose a working fluid, and said first flexible substrate structure and said second flexible substrate structure are sealed through low-temperature hot melting or low-temperature sintering, making an air-tight encapsulation of the working fluid between the first flexible substrate structure and the second flexible substrate structure.

A first conductive metal film is formed on the side of the first flexible substrate structure toward the working fluid, and a second conductive metal film is formed on the side of the second flexible substrate structure toward the working fluid.

A wicking structure is provided between the first flexible substrate structure and the second flexible substrate structure, so that a plurality of wicking spaces is formed between the first flexible substrate structure and the second flexible substrate structure.

The wicking structure is mainly made up of a web, a plurality of first copper posts, and a plurality of second copper posts, wherein each of the first copper posts is respectively formed on the side of the first conductive metal film facing toward the working fluid, and each of the second copper posts is respectively formed on the side of the second conductive metal film facing toward the working fluid. The web is connected to each of the first copper posts and each of the second copper posts, thus forming each of the wicking spaces.

The web is selected from a group made up of metal web, polymer web, web covered by hydrophilic coating and web covered by hydrophobic coating.

A first polymer film is formed on the side of the first flexible substrate structure away from the working fluid, and a second polymer film is formed on the side of the second flexible substrate structure away from the working fluid. The first polymer film and the second polymer film are respectively made of non-conducting polymers with high thermal stability.

A circuit unit is formed at least partially on the side of the first polymer film away from the working fluid. The circuit unit is configured with a junction of electric circuits, so that the circuit unit can be coupled with a control circuit of the electronic device to improve the space efficiency of the electronic device.

Based on such an innovative and unique design, the present invention makes a distinct contrast to prior art in that it can integrate electronic components and circuit unit, and can evenly dissipate the heat generated by the electronic components and circuit units. It can effectively improve the space efficiency of the electronic device. This is indeed a practical inventive step.

DETAILED DESCRIPTION OF THE INVENTION

The above drawings have disclosed a plurality of practical embodiments of the present invention of thin vapor chamber with circuit unit. However, such embodiments are illustrative only and are not intending to limit the scope of the invention.

Figure 1:
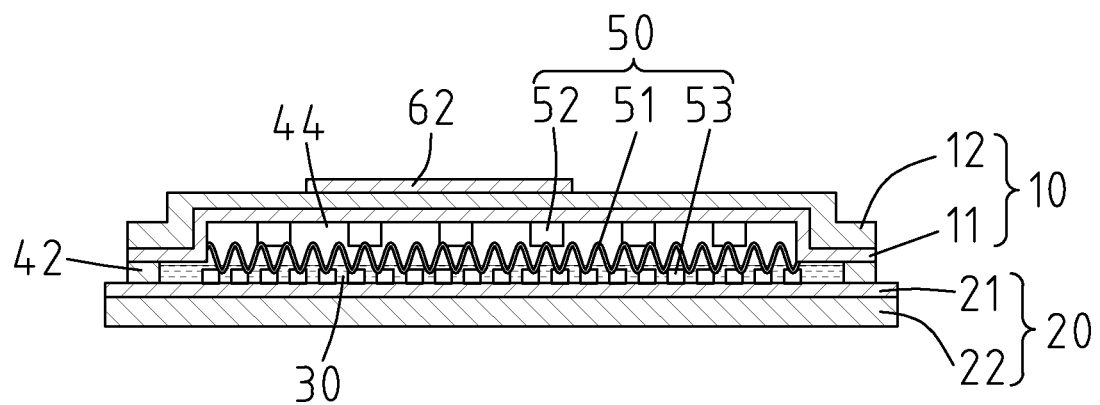
FIG. 1 is a sectional view of Embodiment 1 of the present invention.

Referring to FIG. 1, Embodiment 1 of the present invention of thin vapor chamber with circuit unit comprises a plate-like first flexible substrate structure 10 and a plate-like second flexible substrate structure 20, wherein said first flexible substrate structure 10 and second flexible substrate structure 20 relatively enclose a working fluid 30. The first flexible substrate structure 10 and the second flexible substrate structure 20 are combined on the edges to form a seal edge 42, making an air-tight encapsulation of the working fluid 30 between the first flexible substrate structure 10 and the second flexible substrate structure 20.

A first conductive metal film 11 is formed on the side of the first flexible substrate structure 10 facing toward the working fluid 30. A first polymer film 12 is formed on the side of the first flexible substrate structure 10 away from the working fluid 30, and the first conductive metal film 11 is formed on the surface of the first polymer film 12 by heat-conductive metal. The first polymer film 12 is made of non-conducting polymers with high thermal stability.

A second conductive metal film 21 is formed on the side of the second flexible substrate structure 20 facing toward the working fluid 30, and a second polymer film 22 is formed on the side of the second flexible substrate structure 20 away from the working fluid 30. And the second conductive metal film 21 is formed on the surface of said second polymer film 22 by heat-conductive metal. The second polymer film 22 is made of non-conducting polymers with high thermal stability.

The first conductive metal film 11 and the second conductive metal film 21 are combined through low-temperature hot melting within the temperature range of 170° C.-350° C. to form a seal edge 42. Alternatively, the first conductive metal film 11 and the second conductive metal film 21 can be combined through sintering within the temperature range of 250° C.-300° C. to form a seal edge 42.

A wicking structure 50 is configured between the first flexible substrate structure 10 and the second flexible substrate structure 20, so that a plurality of wicking spaces 44 is formed between the first flexible substrate structure 10 and the second flexible substrate structure 20.

The wicking structure 50 is mainly made up of a web 51, a plurality of first copper posts 52 and a plurality of second copper posts 53, wherein each of the first copper posts 52 is respectively formed on the side of the first conductive metal film 11 facing toward the working fluid 30, each of the second copper posts 53 is respectively formed on the side of the second conductive metal film 21 facing toward the working fluid 30. The web 51 is connected to each of the first copper posts 52 and each of the second copper posts 53, forming each of the wicking spaces 44.

The above-mentioned structure is the same as existing thin vapor chamber.

The web 51 is selected from a group made of metal web, polymer web, web covered by hydrophilic coating and web covered by hydrophobic coating. Furthermore, the metal web is made of one or more kinds of copper web, stainless steel web or copper-clad web.

Figure 2:
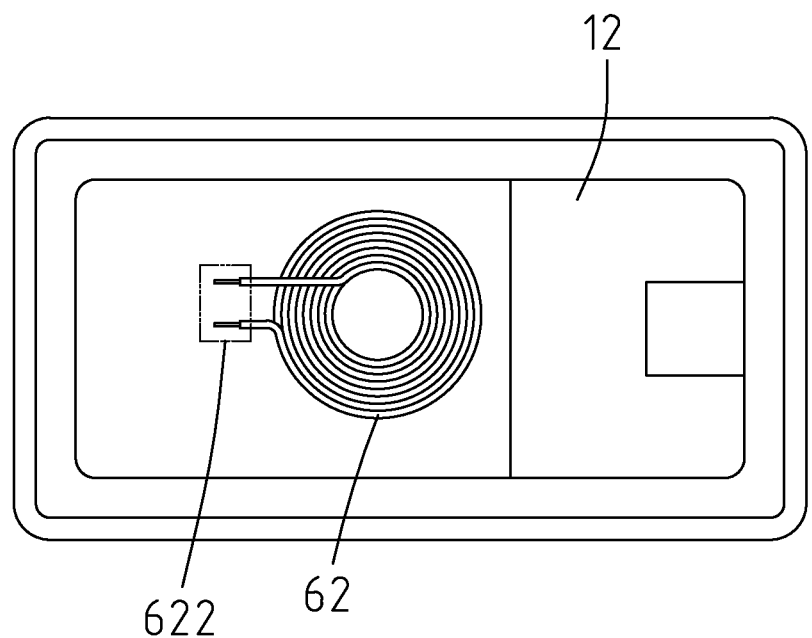
FIG. 2 is a top view of Embodiment 1 of the present invention, showing the electric circuit of the first circuit unit.

A first circuit unit 62 is formed on the side of the first polymer film 12 away from the working fluid 30. Referring to FIG. 2, the first circuit unit 62 is configured with a first junction of electric circuits 622. The first circuit unit 62 is coupled with a control circuit (not shown in the figures) of the electronic device through the first junction of electric circuits 622. The first circuit unit 62 is a coil for passage of the current during charging and discharging of the electronic device. Thus, when the first circuit unit 62 is under the environment of a magnetic field, the first circuit unit 62 can generate an induced current, and the induced current can act as the current to charge the secondary battery (not shown in the figures) of the electronic device. During discharging, when the current from the secondary battery passes through the first circuit unit 62, the first circuit unit 62 will produce a magnetic field, to immediately provide wireless charging for other electronic devices.

When the current passes through the first circuit unit 62, and the first circuit unit 62 is heated, the heat from the first circuit unit 62 is transmitted through the first flexible substrate structure 10 to the working fluid 30, and is dissipated by the working fluid 30 to maintain a uniform temperature.

The first conductive metal film 11 and the second conductive metal film 21 can shield the electromagnetic wave generated by the first circuit unit 62 during current passage. Through appropriate space arrangement of the electronic device, the first conductive metal film 11 and the second conductive metal film 21 can offer protection against the electromagnetic wave within a range defined by preset directions and angles.

In Embodiment 1, the second flexible substrate structure 20 can be configured on an electronic component (not shown in the figures) of the electronic device. The electronic component can be an arithmetic unit, a processing unit, a battery or any other electronic component that can easily generate heat. In this case, the second flexible substrate structure 20 directly contacts the heat-conducting surface of the electronic component. The heat generated by the electronic component is transmitted through the second flexible substrate structure 20 to the working fluid 30, and is dissipated by the working fluid to maintain a uniform temperature.

In Embodiment 1, the portion of the first flexible substrate structure 10 without formation of the first circuit unit 62 can also contact directly with another electronic component (not shown in the figures) that can easily generate heat, so that the first flexible substrate structure 10 can transmit the heat generated by another electronic component to the working fluid 30, and the heat is dissipated by the working fluid to maintain a uniform temperature.

Furthermore, the first polymer film 12 and the second polymer film 22 are respectively made of polyimide (known as PI) or modified polyimide (known as MPI) or liquid crystal polymer (known as LCP).

As the first flexible substrate structure 10 is mainly made up of the first conductive metal film 11 and the first polymer film 12, the second flexible substrate structure 20 is mainly made up of the second conductive metal film 21 and the second polymer film 22, the first flexible substrate structure 10 and the second flexible substrate structure 20 respectively have the characteristics of slight flexural deformation. Thus, when the first flexible substrate structure 10 or the second flexible substrate structure 20 contacts the heat-conducting surface of the electronic component, the first flexible substrate structure 10 or the second flexible substrate structure 20 can match the shape of the heat-conducting surface and contact the heat-conducting surface tightly; on the other hand, as the first flexible substrate structure 10 and the second flexible substrate structure 20 respectively have the characteristics of slight flexural deformation, the first flexible substrate structure 10 or the second flexible substrate structure 20 can have appropriate deformation to meet the space requirement of the electronic device.

Figure 3:
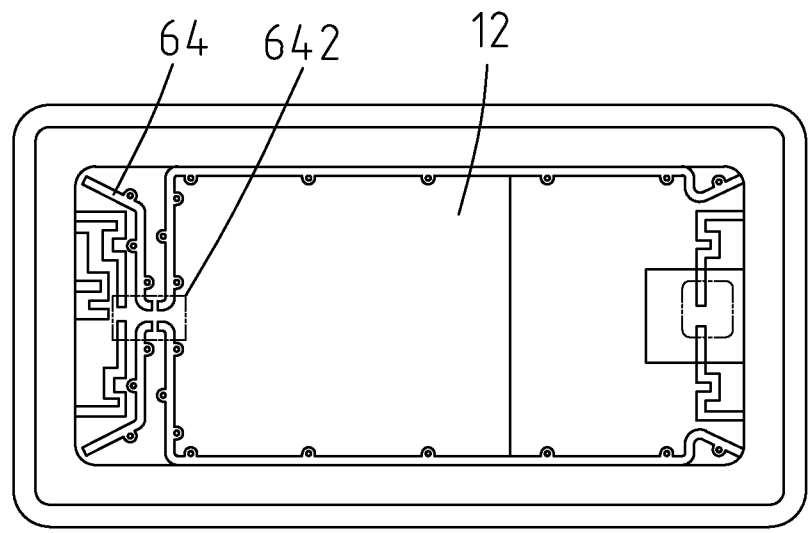
FIG. 3 is a top view of Embodiment 2 of the present invention, showing the electric circuit of the second circuit unit.

Embodiment 2 is a variation from Embodiment 1. The structures of Embodiment 2 identical to Embodiment 1 are not described again here. Referring to FIG. 3, the structures of Embodiment 2 different from Embodiment 1 are mainly as follows: the side of the first polymer film 12 of the first flexible substrate structure away from the working fluid (not shown in the figures) is formed with a second circuit unit 64. The second circuit unit 64 is configured with a second junction of electric circuits 642, so that the second circuit unit 64 can couple with a control circuit (not shown in the figures) of the electronic device through the second junction of electric circuits 642. The second circuit unit 64 is an antenna circuit. Thus, when the second circuit unit 64 emits or receives radio signals, electric current will pass through the second circuit unit 64, causing the second circuit unit 64 to heat up. The heat generated by the second circuit unit 64 will be transmitted through the first flexible substrate structure to the working fluid, and be dissipated by the working fluid to maintain a uniform temperature.

Furthermore, when the second circuit unit 64 is an antenna circuit, the first conductive metal film (not shown in the figures) of the first flexible substrate structure can form the grounding of the second circuit unit 64, and the first conductive metal film and the second conductive metal film (not shown in the figures) of the second flexible substrate structure can shield the electromagnetic wave formed by the radio wave emitted by the second circuit unit 64. Thus, the field pattern of the radio wave emitted by the second circuit unit 64 can be adjusted, and through appropriate space arrangement of the electronic device, the first conductive metal film and the second conductive metal film can offer protection against the electromagnetic wave within a range defined by preset directions and angles.

Figure 4:
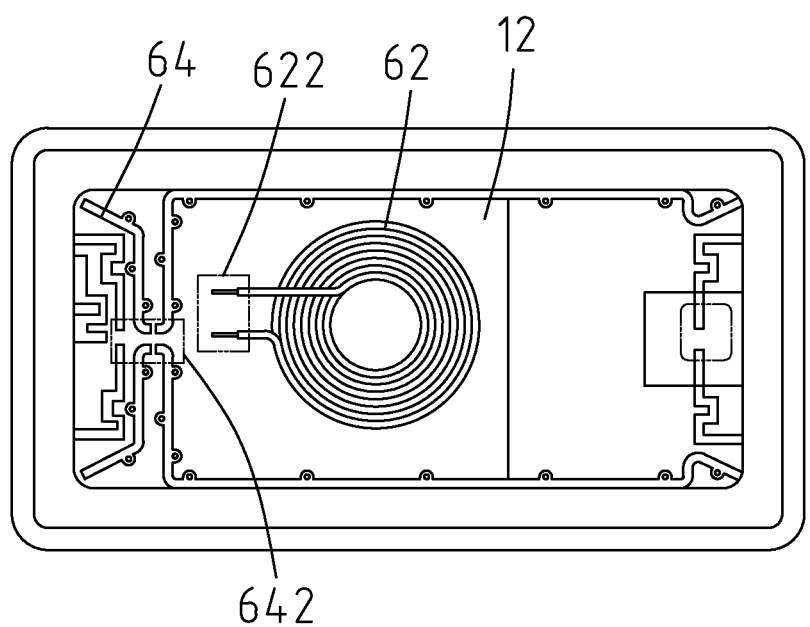
FIG. 4 is a top view of Embodiment 3 of the present invention, showing the electric circuit of the first circuit unit and the second circuit unit.

Embodiment 3 is a variation from Embodiment 1 and Embodiment 2. The structures of Embodiment 3 identical to Embodiment 1 and Embodiment 2 are not described again here. Referring to FIG. 4, the structures of Embodiment 3 different from Embodiment 1 and Embodiment 2 are mainly as follows: the side of the first polymer film 12 of the first flexible substrate structure away from the working fluid (not shown in the figures) is formed with a first circuit unit 62 and a second circuit unit 64. The first circuit unit 62 is configured with a first junction of electric circuits 622, and the second circuit unit 64 is configured with a second junction of electric circuits 642, thus the first circuit unit 62 and the second circuit unit 64 can respectively couple with a control circuit (not shown in the figures) of the electronic device. The first circuit unit 62 is a coil for passage of the current during charging and discharging of the electronic device. The second circuit unit 64 is an antenna circuit. In such an arrangement, the heat generated by the first circuit unit 62 and the second circuit unit 64 will be respectively transmitted through the first flexible substrate structure to the working fluid, and be dissipated by the working fluid to maintain a uniform temperature.

Furthermore, the first circuit unit 62 and the second circuit unit 64 are respectively formed by an etched conductive metal film.

Figure 5:
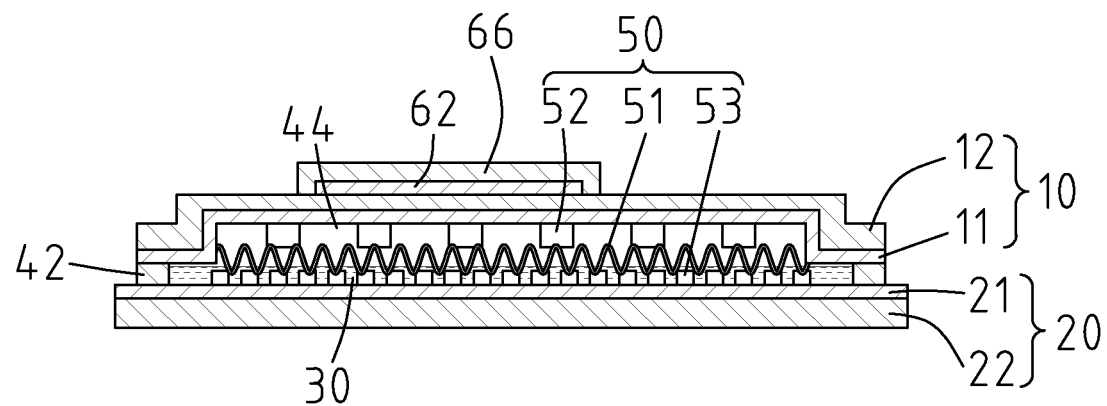
FIG. 5 is a sectional view of Embodiment 4 of the present invention.

Embodiment 4 is a variation from Embodiment 1. The structures of Embodiment 4 identical to Embodiment 1 are not described again here. Referring to FIG. 5, the structures of Embodiment 4 different from Embodiment 1 are as follows: the side of the first circuit unit 62 away from the first flexible substrate structure 10 is formed with a non-conducting film 66 to provide a protection and avoid short circuits of the first circuit unit 62, and as needed, the non-conducting film 66 can choose not to cover the first junction of electric circuits (not shown in the figures) of the first circuit unit 62, so that the non-conducting film 66 will not affect the convenience of coupling between the first circuit unit 62 and the control circuit (not shown in the figures) of the electronic device.

Figure 6:
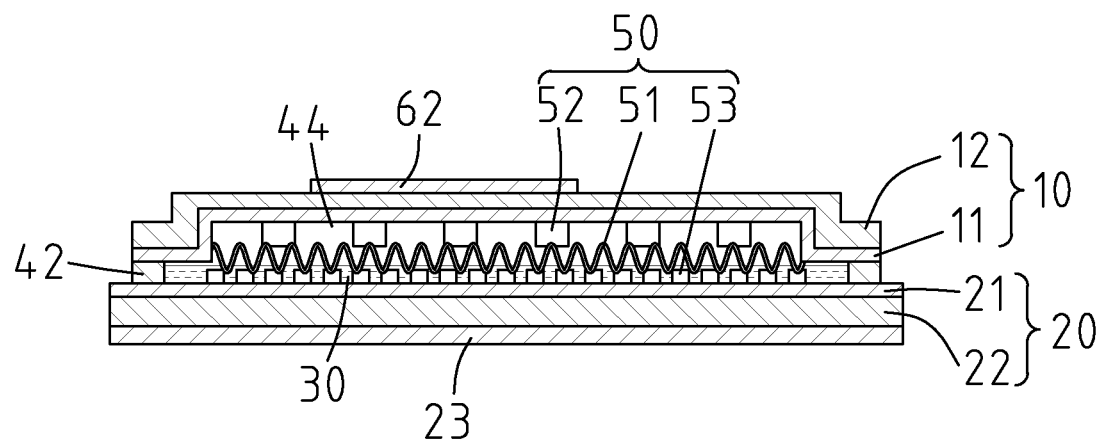
FIG. 6 is a sectional view of Embodiment 5 of the present invention.

Embodiment 5 is a variation from Embodiment 1. The structures of Embodiment 5 identical to Embodiment 1 are not described again here. Referring to FIG. 6, the structures of Embodiment 5 different from Embodiment 1 are mainly as follows: the side of the second polymer film 22 away from the second conductive metal film 21 is formed with an enhancing film 23. The enhancing film 23 is made of heat-conductive material to enhance the strength of the second polymer film 22.

The enhancing film 23 is preferably formed by heat-conductive metal. The height from the top edge of the first polymer film 12 to the bottom edge of the enhancing film 23 is preferably less than 2 mm.

Figure 7:
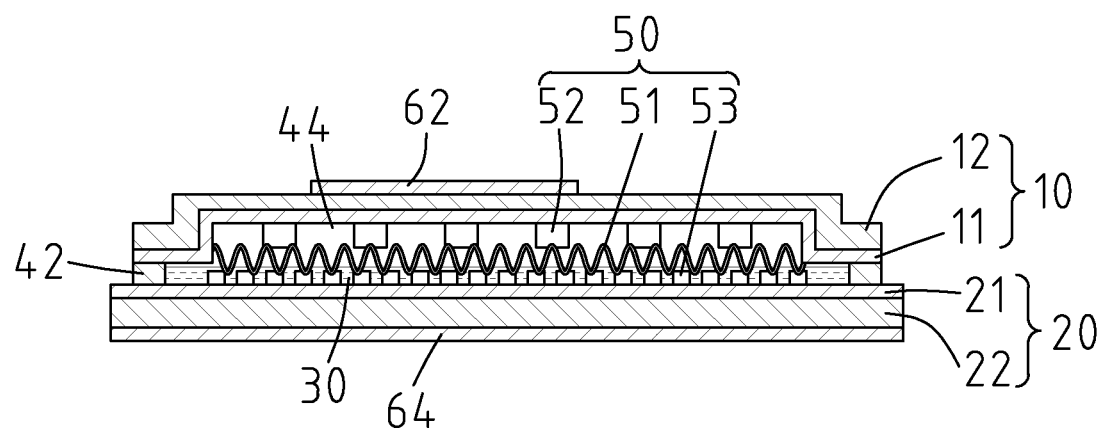
FIG. 7 is a sectional view of Embodiment 6 of the present invention.

Embodiment 6 is a variation from Embodiment 1. The structures of Embodiment 6 identical to Embodiment 1 are not described again here. Referring to FIG. 7, the structures of Embodiment 6 different from Embodiment 1 are mainly as follows: the side of the first polymer film 12 of the first flexible substrate structure 10 away from the working fluid 30 is formed with a first circuit unit 62. The first circuit unit 62 is configured with a first junction of electric circuits (not shown in the figures). The side of the second polymer film 22 of the second flexible substrate structure 20 away from the working fluid 30 is formed with a second circuit unit 64. The second circuit unit 64 is configured with a second junction of electric circuits (not shown in the figures). With such an arrangement, the first circuit unit 62 and the second circuit unit 64 can be respectively coupled with a control circuit (not shown in the figures) of the electronic device. The first circuit unit 62 is a coil for passage of electric current during charging and discharging of the electronic device. The second circuit unit 64 is an antenna circuit. The heat generated by the first circuit unit 62 is transmitted through the first flexible substrate structure 10 to the working fluid 30. The working fluid 30 is dissipated by the working fluid to maintain a uniform temperature. The heat generated by the second circuit unit 64 is transmitted through the second flexible substrate structure 20 to the working fluid 30, and is dissipated by the working fluid to maintain a uniform temperature.

The first circuit unit 62 and the second circuit unit 64 are respectively circuit unit embodiments. Based on the above descriptions, those skilled in the art can choose to alter the numbers and forms of the circuit units, without limitation to the coil and antenna circuit described above as examples. Based on the descriptions of the present invention, such alterations can be easily understood by those skilled in the art.

As described above, the present invention can integrate the electronic components and circuit units, and evenly dissipate the heat generated by the electronic components and circuit units. It can effectively improve the space efficiency of the electronic device.

I claim:

1. A thin vapor chamber with circuit unit, comprising:
a plate-like first flexible substrate structure and a plate-like second flexible substrate structure, wherein said first flexible substrate structure and said second flexible substrate structure relatively enclose a working fluid, and the first flexible substrate structure and the second flexible substrate structure are combined through low-temperature hot melting or low-temperature sintering to form a seal edge, thus making an air-tight encapsulation of the working fluid between the first flexible substrate structure and the second flexible substrate structure;
a first conductive metal film is formed on the side of the first flexible substrate structure facing toward the working fluid; a second conductive metal film is formed on the side of the second flexible substrate structure facing toward the working fluid;
a wicking structure is configured between the first flexible substrate structure and the second flexible substrate structure, so that a plurality of wicking spaces is formed between the first flexible substrate structure and the second flexible substrate structure;
the wicking structure is mainly made up of a web, a plurality of first copper posts, and a plurality of second copper posts, wherein each of the first copper posts is respectively formed on the side of first conductive metal film facing toward the working fluid, and each of the second copper posts is respectively formed on the side of second conductive metal film facing toward the working fluid; the web is connected to each of the first copper posts and each of the second copper posts, thus forming each of the wicking spaces; the web is selected from a group made up of metal web, polymer web, web covered by hydrophilic coating and web covered by hydrophobic coating;
a first polymer film is formed on the side of the first flexible substrate structure away from the working fluid, and a second polymer film is formed on the side of the second flexible substrate structure away from the working fluid; the first polymer film and the second polymer film are respectively made of non-conducting polymers with high thermal stability; a circuit unit is formed at least partially on the side of the first polymer film away from the working fluid; the circuit unit is configured with a junction of electric circuits, so that the circuit unit can be coupled with a control circuit of the electronic device to improve the space efficiency of the electronic device.

2. The thin vapor chamber with circuit unit defined in claim 1, wherein said circuit unit is a coil for passage of the current during charging and discharging of the electronic device, so that the circuit unit can release its heat through the working fluid and maintain a uniform temperature.

3. The thin vapor chamber with circuit unit defined in claim 1, wherein said circuit unit is an antenna circuit, so that the circuit unit can release its heat through the working fluid and maintain a uniform temperature.

4. The thin vapor chamber with circuit unit defined in claim 1, wherein the side of said first polymer film away from the working fluid is formed with two circuit units, each of the circuit unit being an antenna circuit and a coil for passage of the current during charging and discharging of the electronic devices, so that each of the circuit unit can respectively release its heat through the working fluid and maintain a uniform temperature.

5. The thin vapor chamber with circuit unit defined in claim 1, wherein said first polymer film and said second polymer film are respectively made of polyimide, or modified polyimide, or liquid crystal polymer.

6. The thin vapor chamber with circuit unit defined in claim 5, wherein said circuit unit is formed by an etched conductive metal film.

7. The thin vapor chamber with circuit unit defined in claim 5, wherein the side of said circuit unit away from the first flexible substrate structure is formed with a non-conducting film to provide a protection and avoid short circuits of the circuit unit.

8. The thin vapor chamber with circuit unit defined in claim 2, wherein said first polymer film and said second polymer film are respectively made of polyimide, or modified polyimide, or liquid crystal polymer.

9. The thin vapor chamber with circuit unit defined in claim 8, wherein said circuit unit is formed by an etched conductive metal film.

10. The thin vapor chamber with circuit unit defined in claim 8, wherein the side of said circuit unit away from the first flexible substrate structure is formed with a non-conducting film to provide a protection and avoid short circuits of the circuit unit.

11. The thin vapor chamber with circuit unit defined in claim 3, wherein said first polymer film and said second polymer film are respectively made of polyimide, or modified polyimide, or liquid crystal polymer.

12. The thin vapor chamber with circuit unit defined in claim 11, wherein said circuit unit is formed by an etched conductive metal film.

13. The thin vapor chamber with circuit unit defined in claim 11, wherein the side of said circuit unit away from the first flexible substrate structure is formed with a non-conducting film to provide a protection and avoid short circuits of the circuit unit.

14. The thin vapor chamber with circuit unit defined in claim 4, wherein said first polymer film and said second polymer film are respectively made of polyimide, or modified polyimide, or liquid crystal polymer.

15. The thin vapor chamber with circuit unit defined in claim 14, wherein said circuit unit is formed by an etched conductive metal film.

16. The thin vapor chamber with circuit unit defined in claim 14, wherein the side of said circuit unit away from the first flexible substrate structure is formed with a non-conducting film to provide a protection and avoid short circuits of the circuit unit.

17. The thin vapor chamber with circuit unit defined in claim 1, wherein the side of said second polymer film away from the second conductive metal film is formed with an enhancing film, said enhancing film being made of heat-conductive material to enhance the strength of the second polymer film.

18. The thin vapor chamber with circuit unit defined in claim 17, wherein said enhancing film is made of heat-conductive metal.

* * * * *